(12) United States Patent
Johnson

(10) Patent No.: US 7,579,852 B2
(45) Date of Patent: Aug. 25, 2009

(54) WAFER TRANSLATOR HAVING METALLIZATION PATTERN PROVIDING HIGH DENSITY INTERDIGITATED CONTACT PADS FOR COMPONENT

(75) Inventor: Morgan T. Johnson, Portland, OR (US)

(73) Assignee: Advanced Inquiry Systems, Inc., Hillsboro, OR (US)

( * ) Notice: Subject to any disclaimer, the term of this patent is extended or adjusted under 35 U.S.C. 154(b) by 0 days.

(21) Appl. No.: 12/079,202

(22) Filed: Mar. 24, 2008

(65) Prior Publication Data

US 2008/0231302 A1    Sep. 25, 2008

Related U.S. Application Data

(60) Provisional application No. 60/919,522, filed on Mar. 22, 2007.

(51) Int. Cl.
*G01R 31/02* (2006.01)
*H01R 9/00* (2006.01)

(52) U.S. Cl. .................... 324/754; 324/765; 439/68
(58) Field of Classification Search ......... 324/754–765; 439/66, 68, 91
See application file for complete search history.

(56) References Cited

U.S. PATENT DOCUMENTS 4,862,077 A * 8/1989 Horel et al. ............. 324/754

* cited by examiner

*Primary Examiner*—Ernest F Karlsen
(74) *Attorney, Agent, or Firm*—Raymond J. Werner

(57) ABSTRACT

A metallization pattern for a wafer translator provides a high density layout of interdigitated contact pads, suitable for component placement, along with larger contact pads suitable for connection to external equipment terminals. In another aspect, electrically conductive material may be added to, or removed from, the high density layout of interdigitated contact pads and larger contact pads to modify, or reconfigure, the electrical pathways of the wafer translator.

12 Claims, 12 Drawing Sheets

WAFER TRANSLATOR HAVING METALLIZATION PATTERN PROVIDING HIGH DENSITY INTERDIGITATED CONTACT PADS FOR COMPONENT

RELATED APPLICATIONS

This non-provisional application claims the benefit of earlier filed provisional application 60/919,522, filed 22 Mar. 2007, and entitled "Wafer Translator Having Metallization Pattern Providing High Density Interdigitated Contact Pads For Component Placement"; the entirety of which is hereby incorporated by reference.

FIELD OF THE INVENTION

The present invention relates generally to semiconductor test equipment, and more particularly relates to methods and apparatus for providing a wafer translator having a metallization pattern providing high density interdigitated contact pads for component placement.

BACKGROUND

Advances in semiconductor manufacturing technology have resulted in, among other things, reducing the cost of sophisticated electronics to the extent that integrated circuits have become ubiquitous in the modern environment.

As is well-known, integrated circuits are typically manufactured in batches, and these batches usually contain a plurality of semiconductor wafers within and upon which integrated circuits are formed through a variety of semiconductor manufacturing steps, including, for example, depositing, masking, patterning, implanting, etching, and so on.

Completed wafers are tested to determine which die, or integrated circuits, on the wafer are capable of operating according to predetermined specifications. In this way, integrated circuits that cannot perform as desired are not packaged, or otherwise incorporated into finished products.

It is common to manufacture integrated circuits on roughly circular semiconductor substrates, or wafers. Further, it is common to form such integrated circuits so that conductive regions disposed on, or close to, the uppermost layers of the integrated circuits are available to act as terminals for connection to various electrical elements disposed in, or on, the lower layers of those integrated circuits. In testing, these conductive regions are commonly contacted with a probe card.

It has been common to mount the wafer on a moveable chuck, which is used to position the wafer relative to a probe card, and to hold the wafer in place during testing. In alternative arrangements for testing the unsingulated integrated circuits of a wafer, a wafer translator is disposed between the wafer and any other testing or connection apparatus.

What is needed are methods and apparatus for disposing a plurality of at least two-terminal electrical components on the wafer translator so that these components are in close proximity to the wafer.

SUMMARY OF THE INVENTION

Briefly, a metallization pattern for a wafer translator provides a high density layout of interdigitated contact pads, suitable for component placement, along with larger contact pads suitable for connection to external equipment terminals. In another aspect, electrically conductive material may be added to, or removed from, the high density layout of interdigitated contact pads and larger contact pads to modify, or reconfigure, the electrical pathways of the wafer translator.

DETAILED DESCRIPTION

Figure 1:
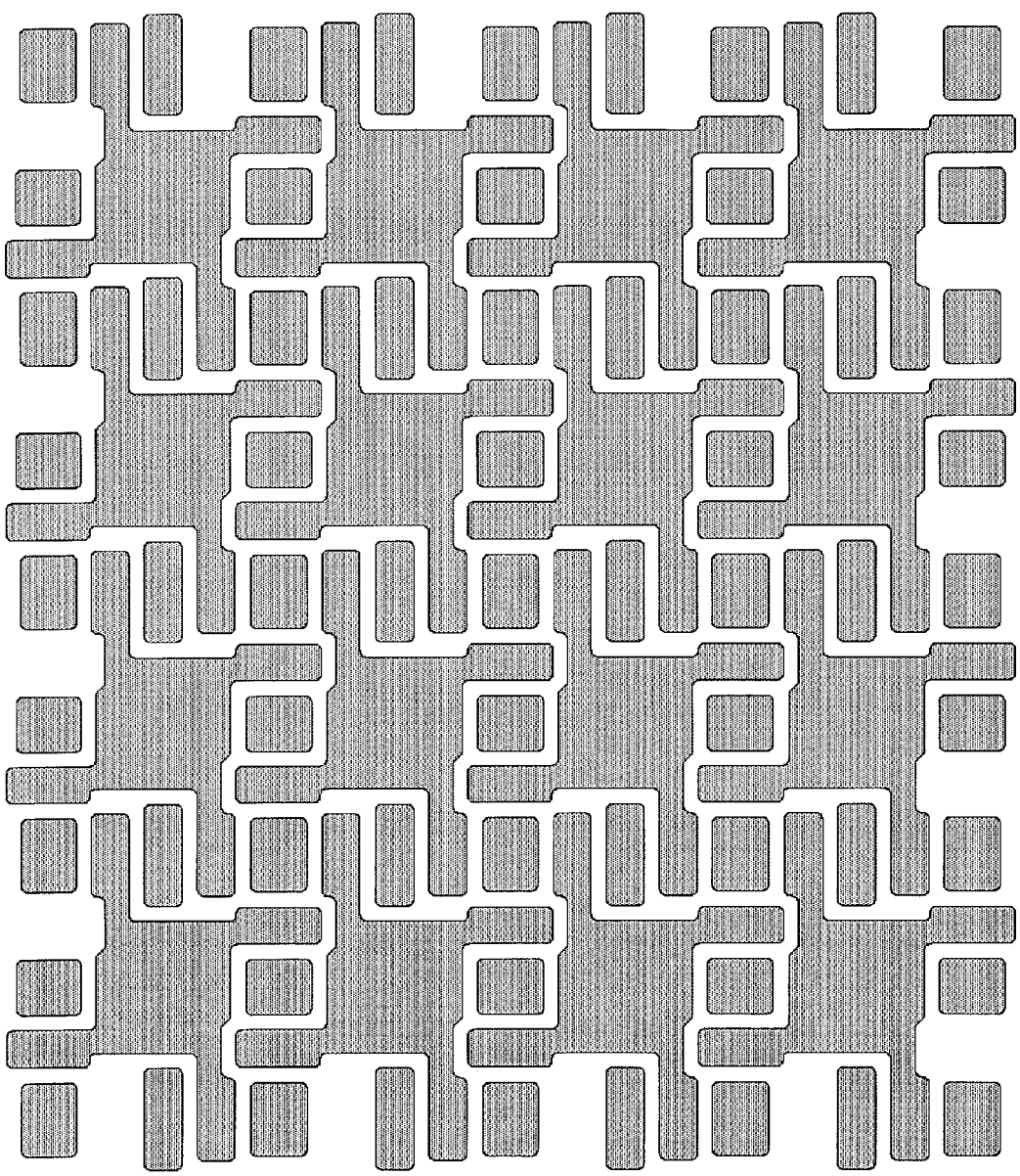
FIG. 1 is a top view of a metallization pattern for a wafer translator that provides a high density layout of interdigitated contact pads along with larger contact pads in accordance with the present invention.

Generally, the use of a wafer translator and a wafer, removably attached to each other, provides the electrical connection to the pads of integrated circuits on a wafer in such a manner that the pads are substantially undamaged in the process of making such electrical connections. Unlike conventional means and methods of providing electrical connections to the pads of integrated circuits for testing purposes, the wafer/wafer translator pair provide electrical connections without "scrubbing" the pads, thereby reducing or eliminating the damage done to pads by conventional processes and equipment. Electrical pathways through the wafer translator provide connection between the pads of the various integrated circuits and conductive patterns on an opposing side of the wafer translator. In a variety of circumstances it is desirable to place various electrical components, including but not limited to resistors and/or capacitors, in close proximity to the integrated circuits. By arranging the patterns of conductive material on the side of the wafer translator that faces away from the wafer, a wide variety of component placement options may be provided.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Terminology

Pad refers to a metallized region of the surface of an integrated circuit, which is used to form a physical connection terminal for communicating signals to and/or from the integrated circuit.

The expression "wafer translator" refers to an apparatus facilitating the connection of pads (sometimes referred to as terminals, I/O pads, contact pads, bond pads, bonding pads, chip pads, test pads, or similar formulations) of unsingulated integrated circuits, to other electrical components. It will be appreciated that "I/O pads" is a general term, and that the present invention is not limited with regard to whether a particular pad of an integrated circuit is part of an input, output, or input/output circuit. A wafer translator is typically disposed between a wafer and other electrical components, and/or electrical connection pathways. The wafer translator is typically removably attached to the wafer (alternatively the wafer is removably attached to the translator). The wafer translator includes a substrate having two major surfaces, each surface having terminals disposed thereon, and electrical pathways disposed through the substrate to provide for electrical continuity between at least one terminal on a first surface and at least one terminal on a second surface. The wafer-side of the wafer translator has a pattern of terminals that matches the layout of at least a portion of the pads of the integrated circuits on the wafer. The wafer translator, when disposed between a wafer and other electrical components, makes electrical contact with one or more pads of a plurality of integrated circuits on the wafer, providing an electrical pathway therethrough to the other electrical components. The wafer translator is a structure that is used to achieve electrical connection between one or more electrical terminals that have been fabricated at a first scale, or dimension, and a corresponding set of electrical terminals that have been fabricated at a second scale, or dimension. The wafer translator provides an electrical bridge between the smallest features in one technology (e.g., pins of a probe card) and the largest features in another technology (e.g., bonding pads of an integrated circuit). For convenience, wafer translator is referred to simply as translator where there is no ambiguity as to its intended meaning. In some embodiments a flexible wafer translator offers compliance to the surface of a wafer mounted on a rigid support, while in other embodiments, a wafer offers compliance to a rigid wafer translator.

The expression "edge extended wafer translator" refers to an embodiment of a translator in which electrical pathways disposed in and/or on the translator lead from terminals, which in use contact the wafer under test, to electrical terminals disposed outside of a circumferential edge of a wafer aligned for connection with, or attached to the edge extended translator.

The expression "translated wafer" refers to a wafer/wafer translator pair that are in the attached state, wherein a predetermined portion of, or all of, the contact pads of the integrated circuits on the wafer are in electrical contact with corresponding electrical connection means disposed on the wafer side of the translator. Removable attachment may be achieved, for example, by means of vacuum, or pressure differential, attachment.

The terms chip, integrated circuit, semiconductor device, and microelectronic device are sometimes used interchangeably in this field. The present invention relates to the manufacture and test of chips, integrated circuits, semiconductor devices and microelectronic devices as these terms are commonly understood in the field.

Referring to FIG. 1, a top view of a metallization pattern for a wafer translator that provides a high density layout of interdigitated component contact pads and larger contact pads in accordance with the present invention is shown. It will be appreciated that although referred to as a metallization pattern, any suitable conductive material or combination of materials may be used.

Figure 2:
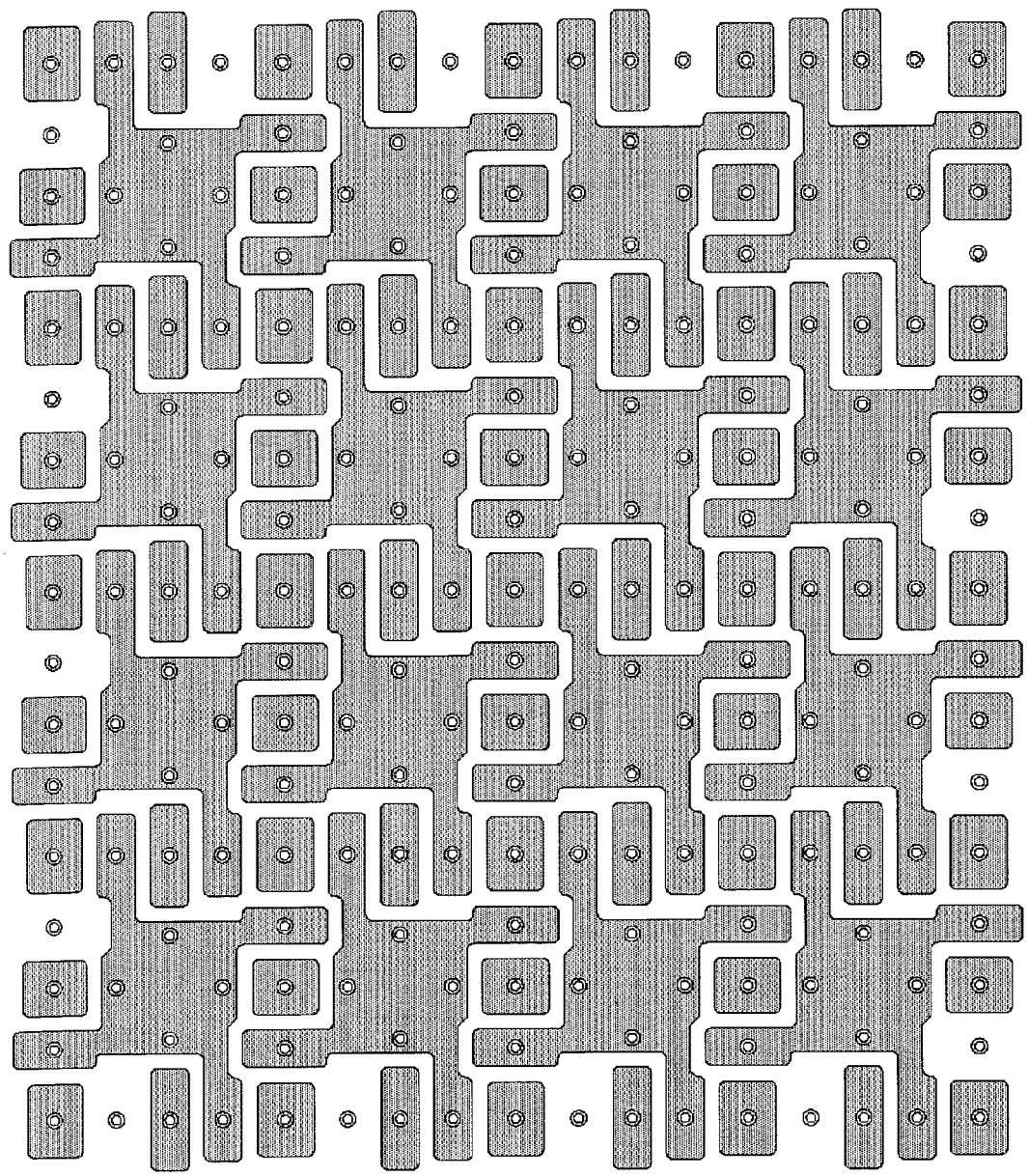
FIG. 2 shows the metallization pattern of FIG. 1 and further shows a regular pattern of vias suitable for providing electrical pathways from a first side of the translator to a second side, or to another connection level of the wafer translator.

FIG. 2 shows the metallization pattern of FIG. 1 and further shows a regular pattern of vias suitable for providing electrical pathways from a first side of the translator to a second side of the translator, or to an internal interconnection level of the wafer translator. In the illustrative embodiment shown in FIG. 2, the vias are shown to have a regularly repeating pattern, and these vias provide each individual piece of conductive material on this surface of the translator with the means to interconnect with the other side of the translator, and/or an internal interconnection level of the translator. It is noted that the present invention is not limited to the illustrated layout of vias.

Figure 3:
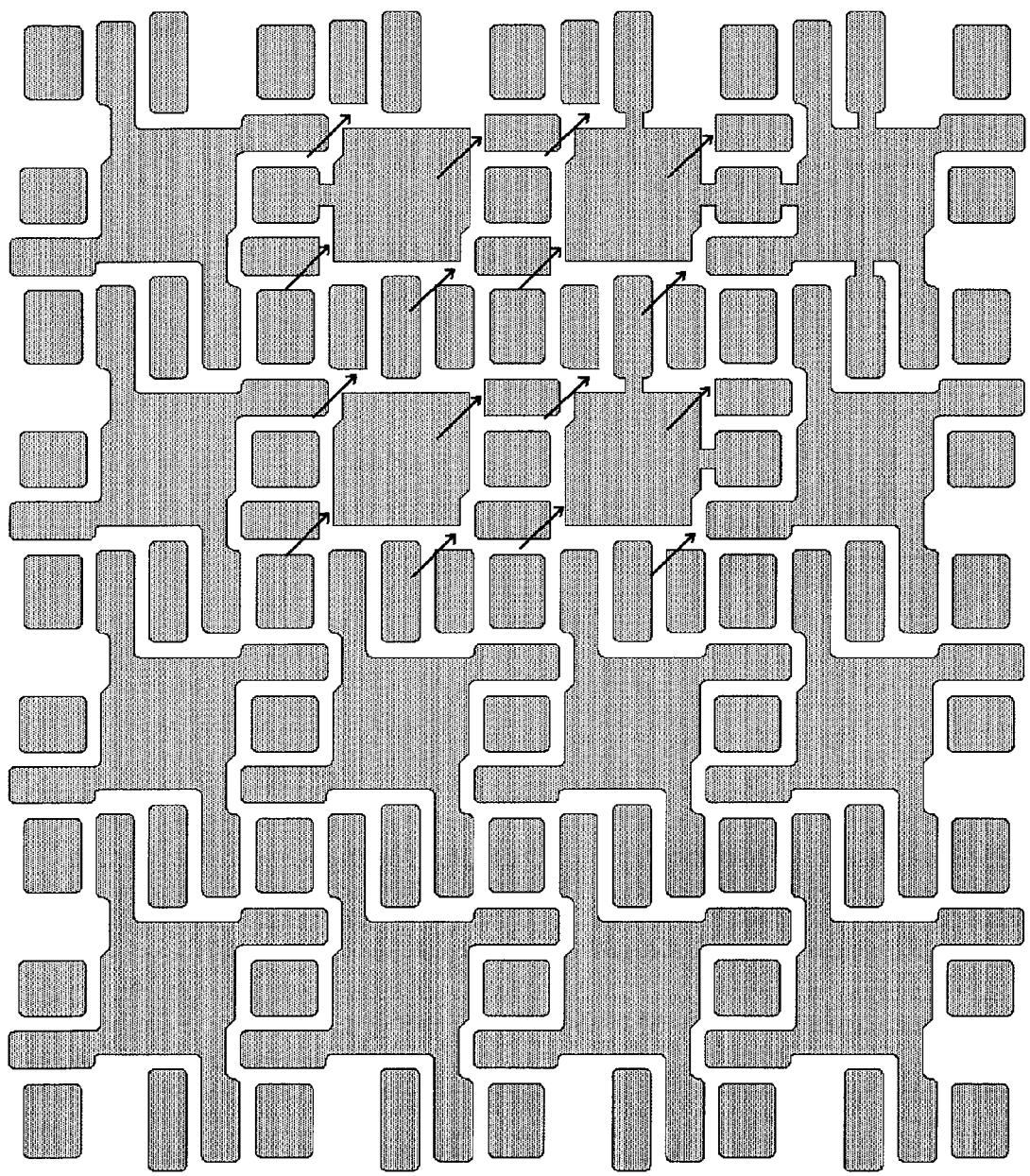
FIG. 3 is a top view of a metallization pattern for a wafer translator similar to that shown in FIG. 1 but reconfigured by adding and deleting several pieces of conductive material so as to provide an alternative set of electrical pathways. Any suitable means may be used for adding and/or deleting conductive material to/from the inquiry-side of the wafer translator. For example, laser etching may be used to open links between regions of electrically conductive material.

FIG. 3 is a top view of a metallization pattern for a wafer translator similar to that shown in FIG. 1 but reconfigured by adding and deleting several pieces of conductive material so as to provide an alternative set of electrical pathways. It can be seen by inspection that a wide variety of customized wiring patterns may be obtained in this way.

Figure 4:
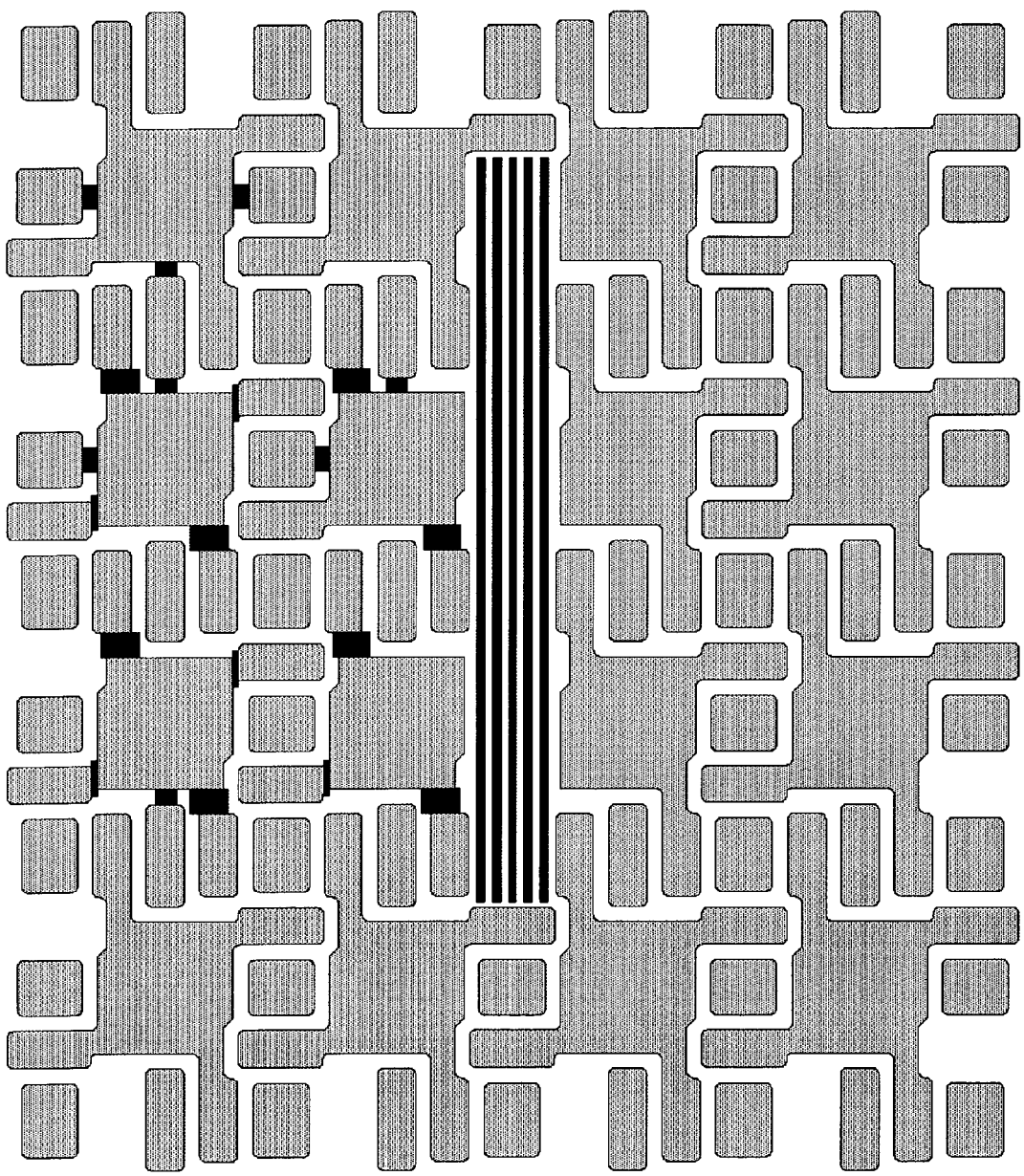
FIG. 4 is a top view of a metallization pattern for a wafer translator similar to that shown in FIG. 1, reconfigured by adding and deleting several pieces of conductive material so as to provide an alternative set of electrical pathways, and in particular including several parallel conductive lines.

FIG. 4, in a manner similar to FIG. 3, provides a top view of a metallization pattern for a wafer translator that is reconfigured by adding and deleting several pieces of conductive material so as to provide an alternative set of electrical pathways, and in particular including several parallel conductive lines. This shows the flexibility of the master metallization template of FIG. 1.

Figure 5:
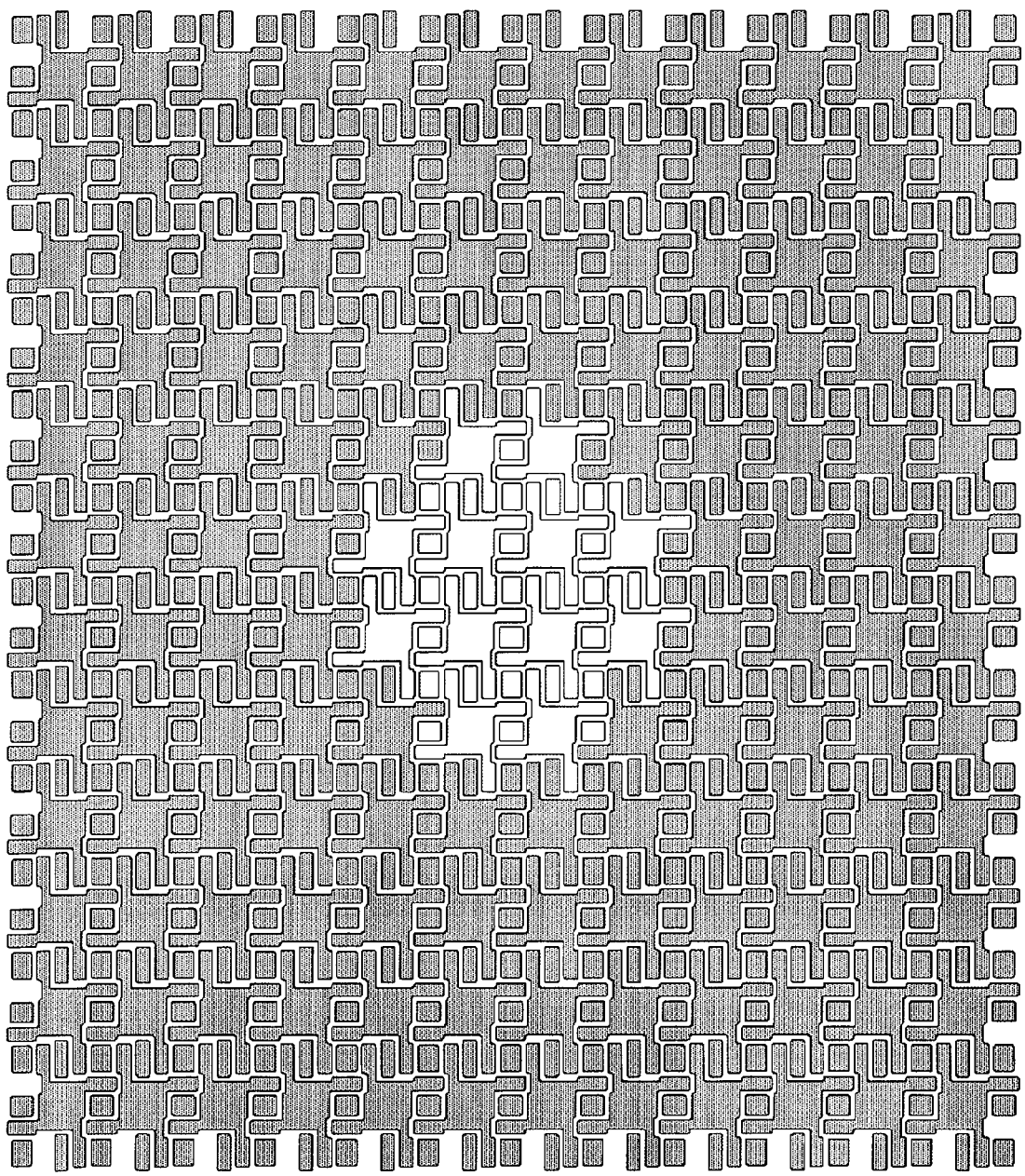
FIG. 5 is a top view of a repeating pattern composed from the pattern of FIG. 1, and further identifying an illustrative portion of the pattern that can be removed to make room for other features.
Figure 6:
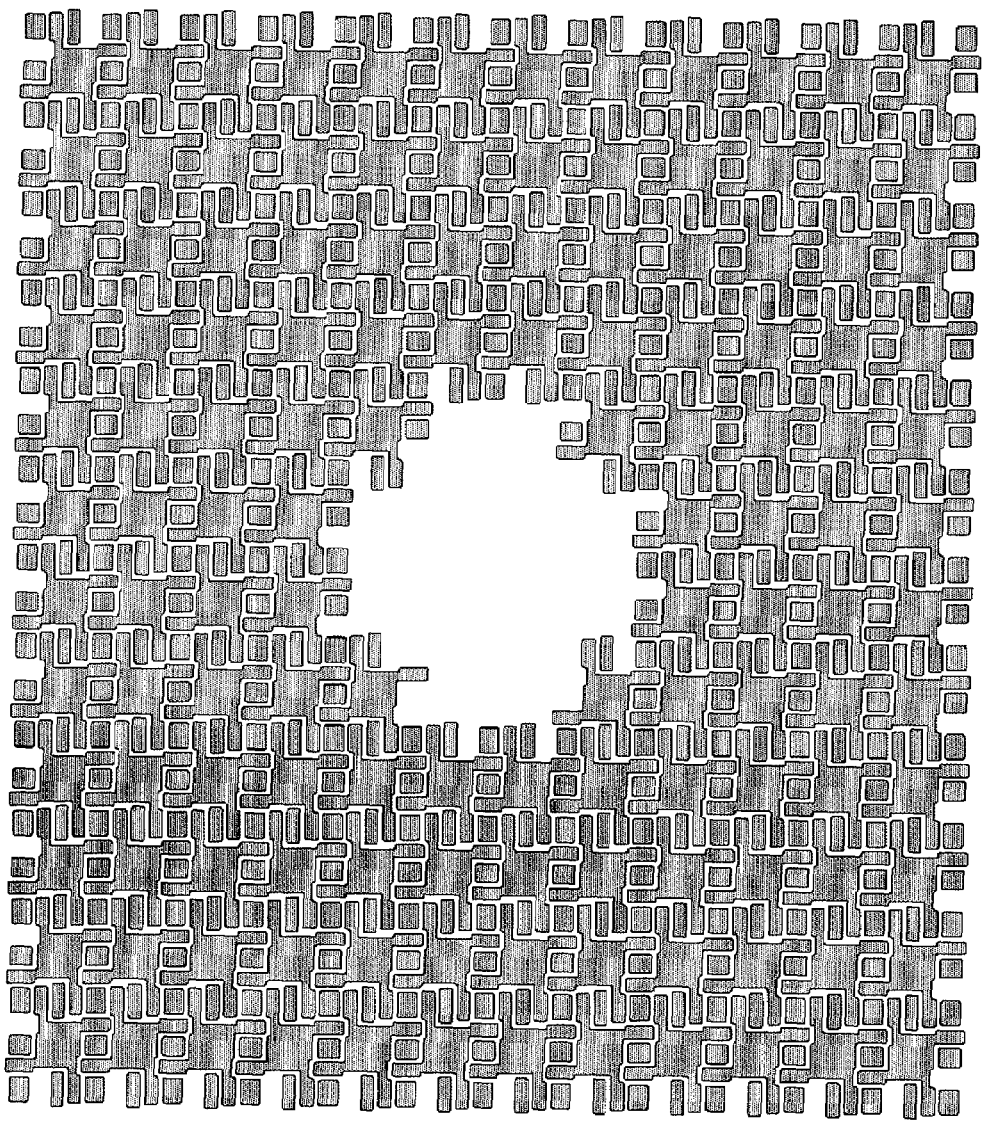
FIG. 6 shows the metallization pattern of FIG. 5 with the identified illustrative portion removed.
Figure 7:
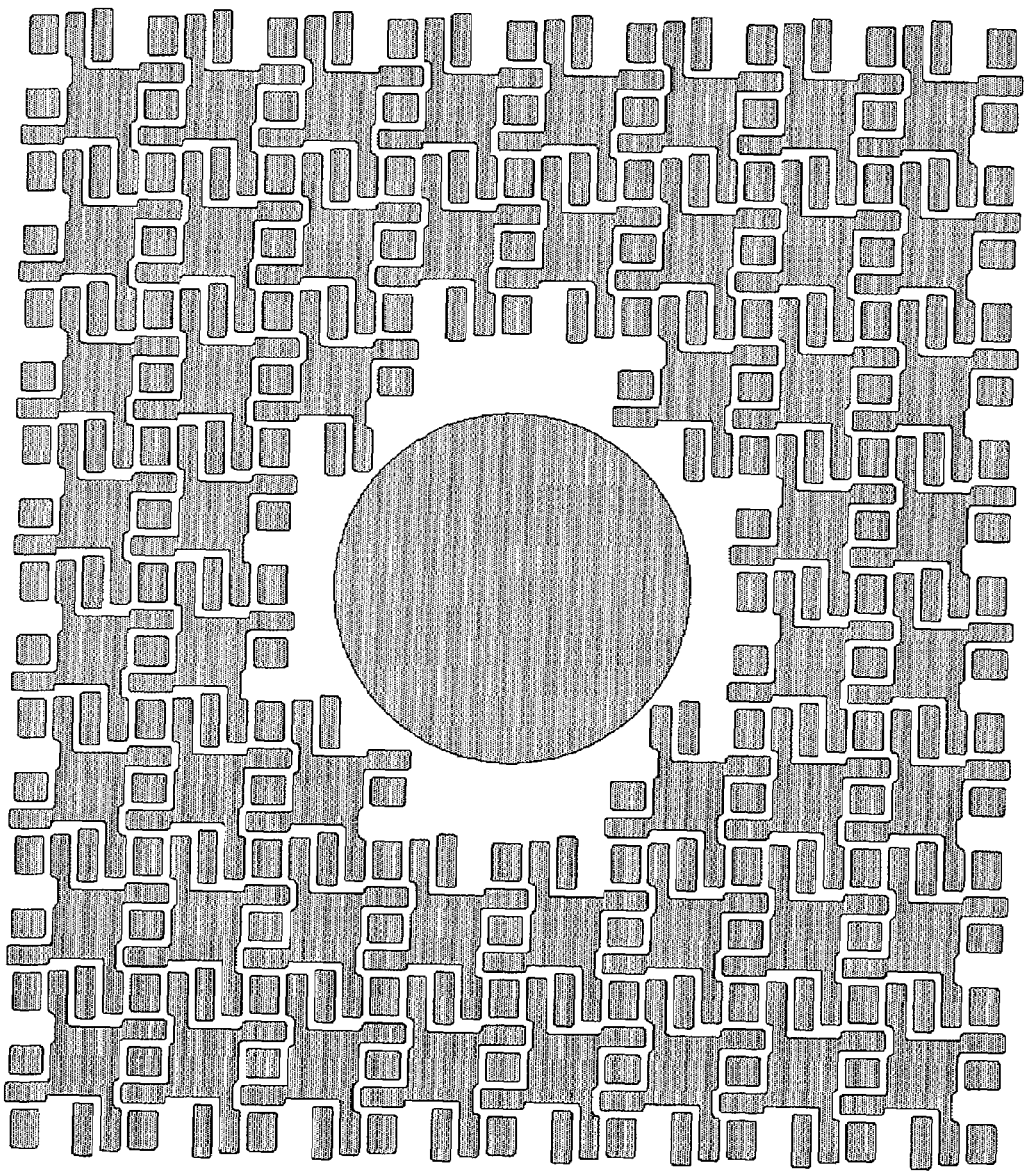
FIG. 7 shows the metallization pattern of FIG. 6 with a circular metal feature disposed in the center thereof.

FIGS. 5-7 illustrate how the master template of FIG. 1 can be used to create a larger pattern which in turn can be modified to accommodate significantly sized features. More particularly, FIG. 5 is a top view of a repeating pattern composed from the pattern of FIG. 1, and further identifying an illustrative portion of the pattern that can be removed to make room for other features. FIG. 6 shows the metallization pattern of FIG. 5 with the identified illustrative portion removed. FIG. 7 shows the metallization pattern of FIG. 6 with a circular metal feature disposed in the center thereof.

Figure 8:
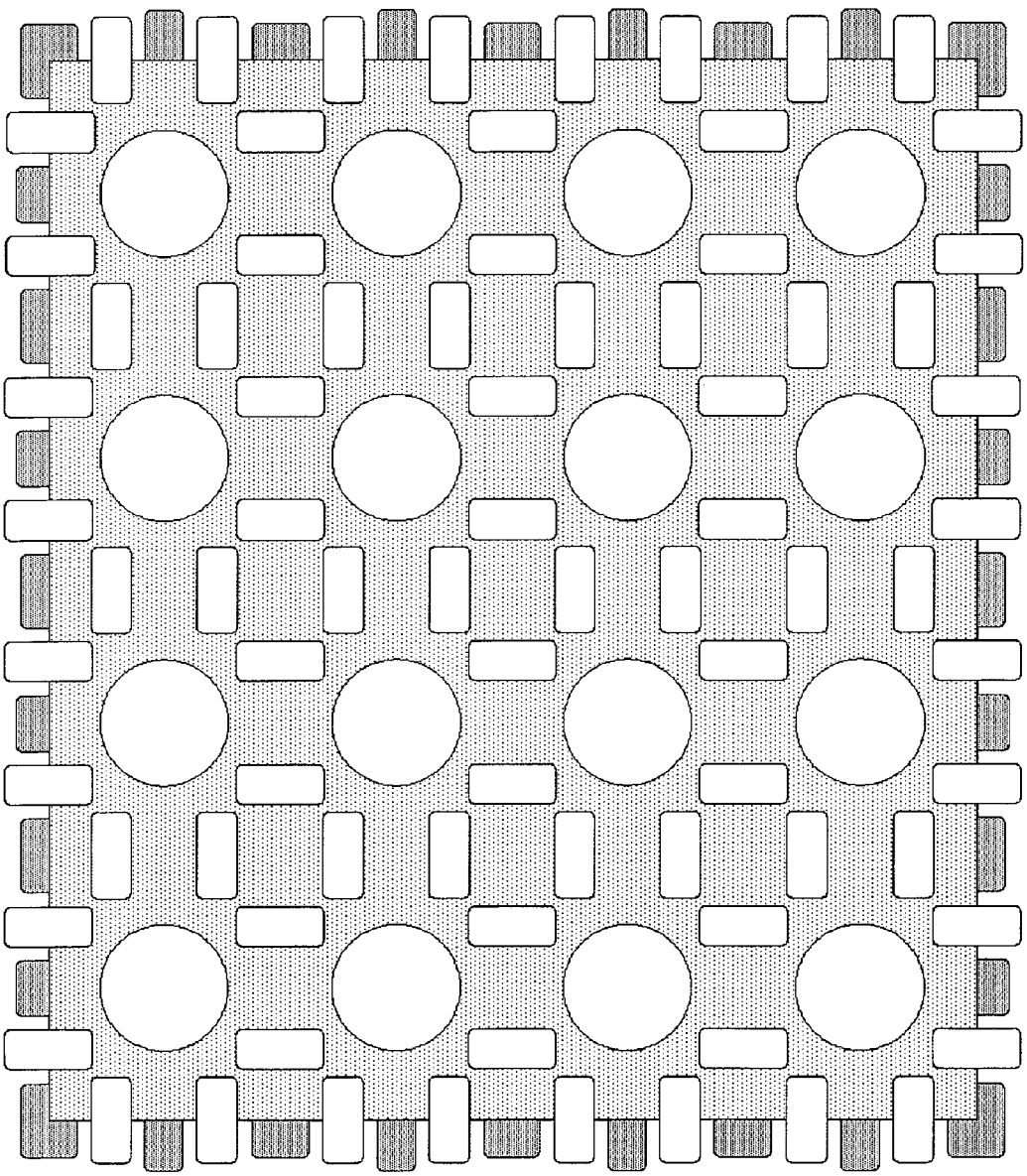
FIG. 8 shows the metallization pattern of FIG. 1 and further shows a solder mask disposed thereon.
Figure 9:
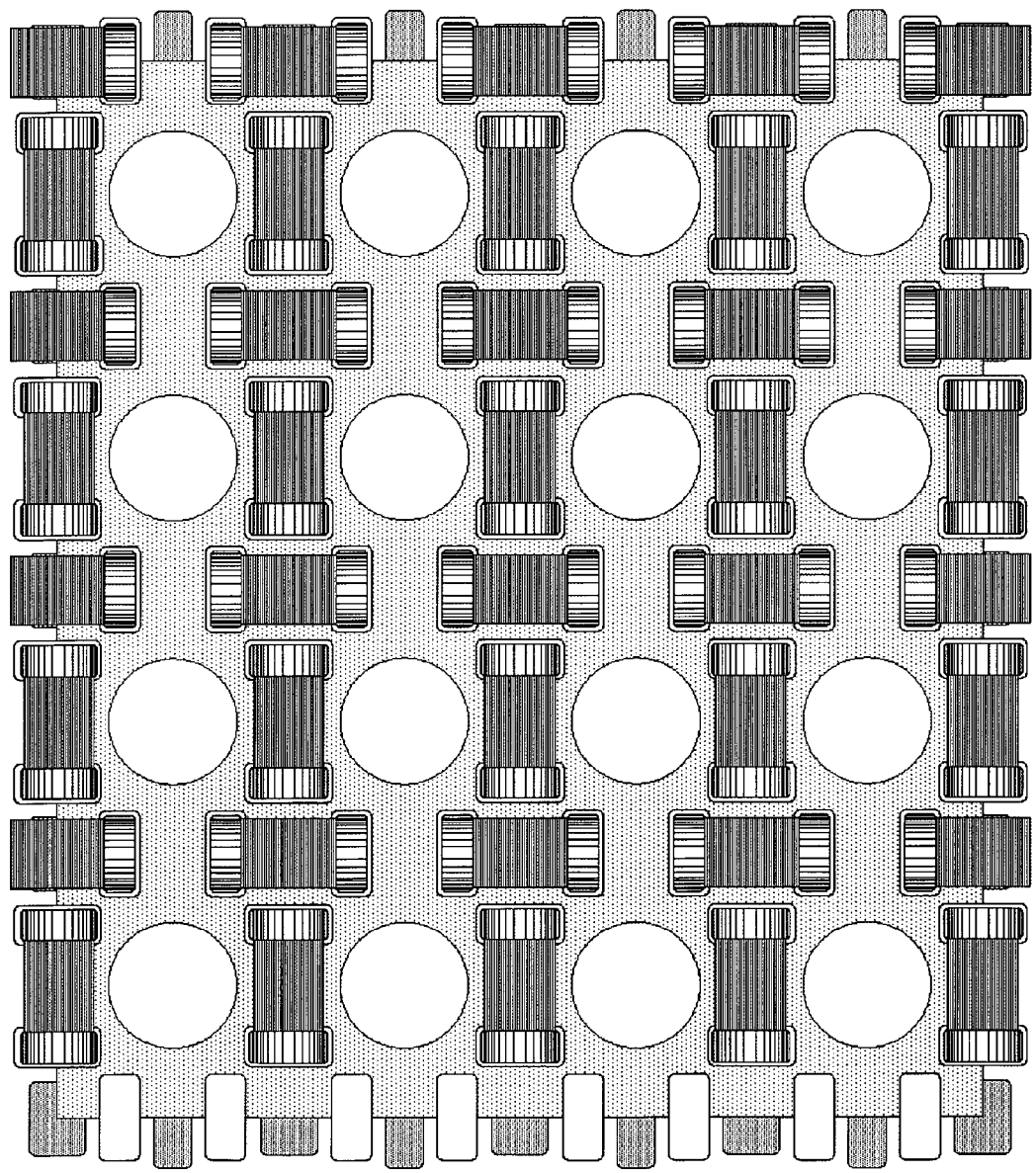
FIG. 9 shows the metallization pattern and solder mask of FIG. 8 and further shows a plurality of two-terminal passive components attached to the conductive material exposed by the solder mask.

Referring to FIGS. 8-9, an embodiment of the present invention including a solder mask is shown. FIG. 8 shows the metallization pattern of FIG. 1 and further shows a solder mask disposed thereon. FIG. 9 shows the metallization pattern and solder mask of FIG. 8 and further shows a plurality of two-terminal passive components attached to the conductive material exposed by the solder mask. It is noted that other electrical components or circuits may be attached to in this way. In an alternative embodiment, one or more attached electrical components is an active two-terminal component (e.g., a diode, or a light emitting diode). In a further alternative, one or more attached electrical components has three or more terminals. Such electrical components may be a transistor or a circuit comprised of several other components housed in a package.

Figure 10:
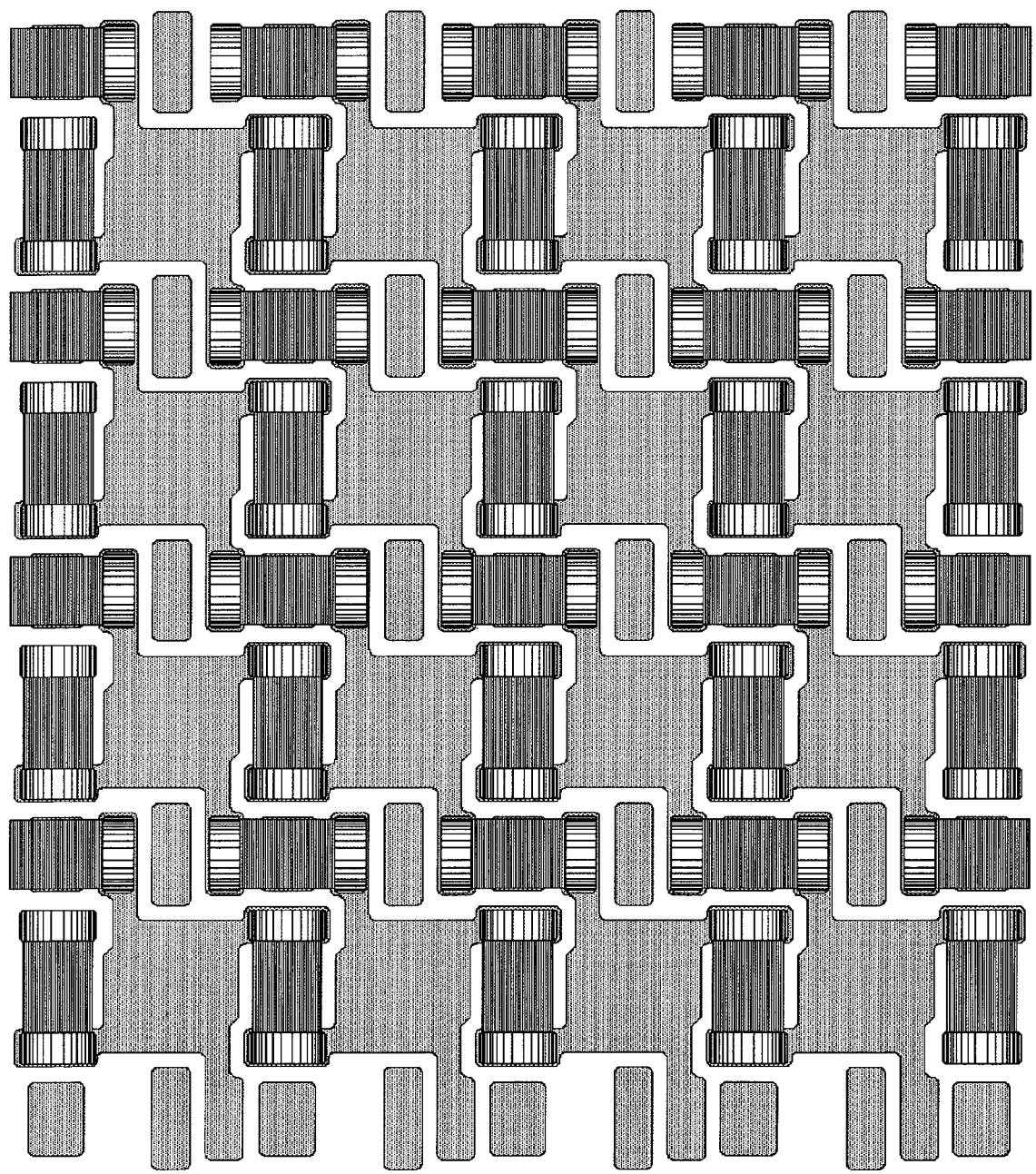
FIG. 10 shows the metallization pattern of FIG. 1 and further shows a plurality of two-terminal passive components attached to an illustrative set of pads.
Figure 11:
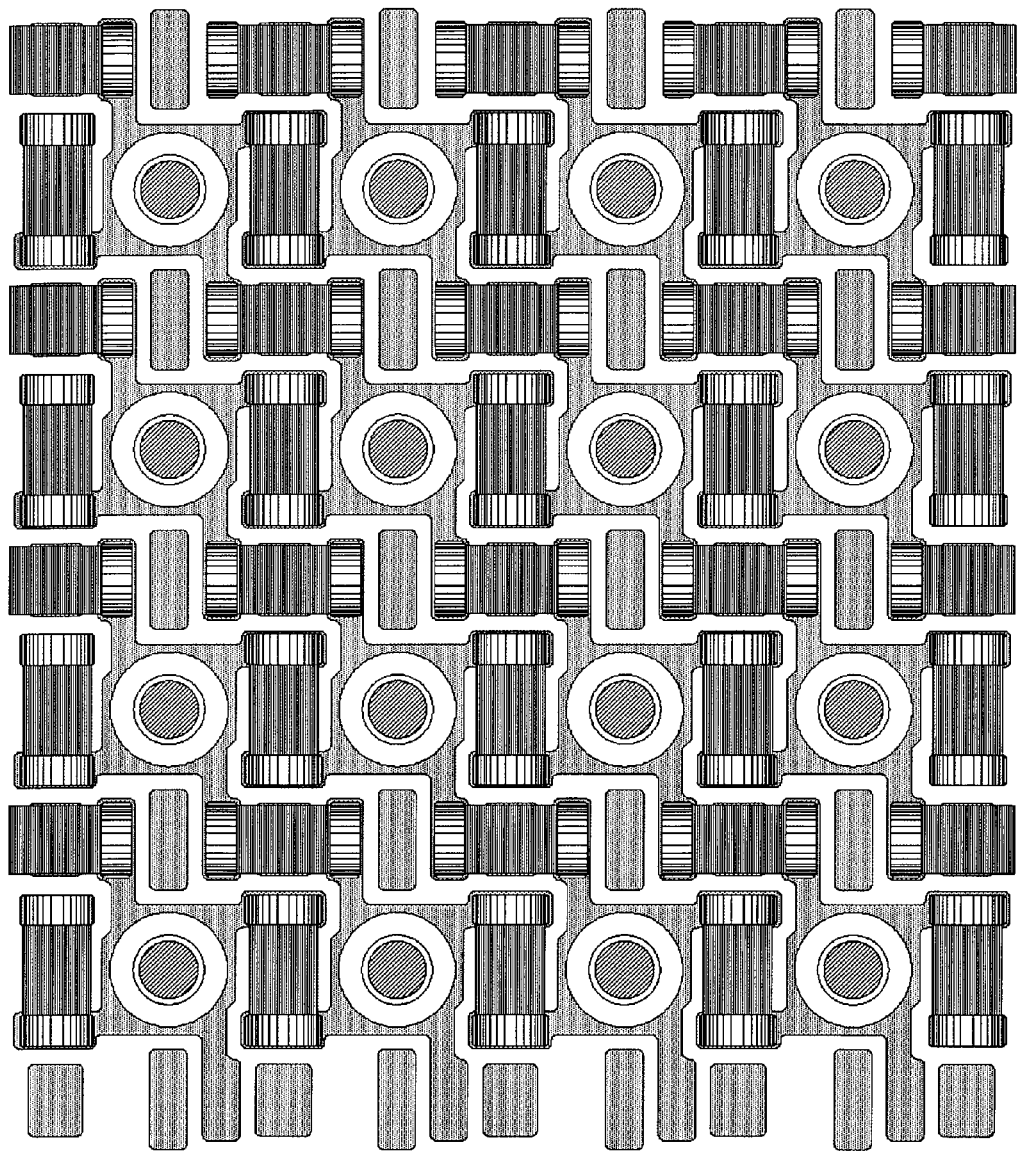
FIG. 11 shows the metallization pattern and component layout of FIG. 10 and further shows a plurality of contact structures disposed on the larger contact pads.

FIGS. 10-11 are similar in that they illustrate a repeating pattern of a metallization layout along with a population of two-terminal electrical components. More particularly, FIG. 10 shows the metallization pattern of FIG. 1 and further shows a plurality of two-terminal passive components attached to an illustrative set of pads. FIG. 11 shows the metallization pattern and component layout of FIG. 10 and further shows a plurality of contact structures disposed on the larger contact pads.

Figure 12:
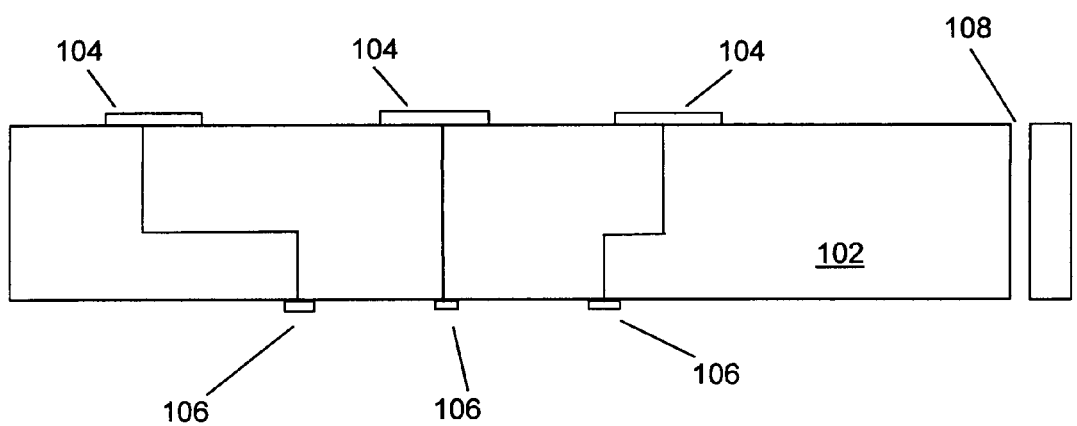
FIG. 12 is a cross-sectional view of an illustrative wafer translator.

FIG. 12 is a cross-sectional view (not to scale) of an illustrative wafer translator. The illustrative wafer translator includes a substrate 102, with contact pads 104 disposed on a first surface, and contact structures 106 disposed on a second surface. An evacuation pathway 108 allows a vacuum to be drawn between the wafer translator and a wafer to which it may be removably attached. Contact structures 106 make physical and electrical contact with the bond pads of integrated circuits on the wafer when such a wafer is attached to the wafer translator. An electrically conductive pathway is provided through substrate 102 so as to electrically connect with contact pads 104. Contact pads 104 provide electrical access to testing equipment. Contact pads 104 are typically much larger than contact structures 106, and are formed so as to have a larger pitch than contact structures 106. Contact structures 106 leave the bond pads to which they come in contact in a substantially undamaged state. That is, the bond pads are not scrubbed in order to make electrical contact.

In one embodiment of the present invention, a wafer translator, include a substrate having a wafer-side and an inquiry-side; a plurality of contact structures disposed on the wafer-side of the substrate; a first plurality of vias, disposed in a regular pattern, the first plurality of vias providing an electrical pathway between the wafer-side and the inquiry-side; a first wafer-side conductor pattern, the first wafer-side conductor pattern providing an electrical pathway between at least one contact structure and at least one of the first plurality of vias; and a first inquiry-side conductor pattern disposed on the inquiry-side, the first inquiry-side conductor pattern including a central contact region and a plurality of coplanar conductive link portions extending therefrom, each of the links having a component placement pad portion at a coplanar distal end thereof, and further including a plurality of unlinked component placement pads disposed adjacent corresponding ones of the linked component placement pad portions; wherein the first inquiry-side conductor pattern is repeated at least twice on the inquiry-side.

In some embodiments, the wafer translator further includes a second plurality of vias, the second plurality of vias providing an electrical pathway between the inquiry-side and an internal interconnection level of the wafer translator. Alternatively, the wafer translator may further include a second plurality of vias, the second plurality of vias providing an electrical pathway between the inquiry-side and an internal interconnection level of the wafer translator, and further providing an electrical pathway between the inquiry-side and the wafer-side.

In some embodiments, the wafer translator further includes at least one electrical component disposed on the inquiry-side, the electrical component having a first terminal in electrical contact with an unlinked component placement pad, and the electrical component having a second terminal in electrical contact with a component placement pad portion. Typically, the first terminal of the electrical component is soldered to the unlinked component placement pad, and the second terminal of the electrical component is soldered to the component placement pad portion.

CONCLUSION

The exemplary apparatus illustrated and described herein find application in at least the field of integrated circuit test and analysis.

It is to be understood that the present invention is not limited to the embodiments described above, but encompasses any and all embodiments within the scope of the subjoined Claims and their equivalents.

What is claimed is:

1. A wafer translator, comprising:
a substrate having a wafer-side and an inquiry-side;
a plurality of contact structures disposed on the wafer-side of the substrate;
a first plurality of vias, disposed in a regular pattern, the first plurality of vias providing an electrical pathway between the wafer-side and the inquiry-side; and
a first inquiry-side conductor pattern disposed on the inquiry-side, the first inquiry-side conductor pattern including a central contact region and a plurality of coplanar conductive link portions extending therefrom, each of the links having a component placement pad portion at a coplanar distal end thereof, and further including a plurality of unlinked component placement pads disposed adjacent corresponding ones of the linked component placement pad portions;
wherein the first inquiry-side conductor pattern is repeated at least twice on the inquiry-side; wherein each of the unlinked component placement pads is electrically isolated from any central contact region; and wherein each of the plurality of contact structures is coupled to a corresponding one of the first plurality of vias.

2. The wafer translator of claim 1, wherein the first inquiry-side conductor pattern is comprised of a metal.

3. The wafer translator of claim 1, further comprising a second plurality of vias, the second plurality of vias providing an electrical pathway between the inquiry-side and an internal interconnection level of the wafer translator.

4. The wafer translator of claim 1, further comprising a second plurality of vias, the second plurality of vias providing an electrical pathway between the inquiry-side and an internal interconnection level of the wafer translator, and further providing an electrical pathway between the inquiry-side and the wafer-side.

5. The wafer translator of claim 1, further comprising at least one electrical component disposed on the inquiry-side, the at least one electrical component having a first terminal in electrical contact with an unlinked component placement pad, and the at least one electrical component having a second terminal in electrical contact with a component placement pad portion.

6. The wafer translator of claim 5, wherein the first terminal of the at least one electrical component is soldered to the unlinked component placement pad, and the second terminal of the at least one electrical component is soldered to the component placement pad portion.

7. A wafer translator, comprising:
a substrate having a wafer-side and an inquiry-side;
a first plurality of vias, the first plurality of vias providing electrical pathways between the wafer-side and the inquiry-side; and a plurality of contact structures disposed on the wafer-side of the substrate, each of the plurality of contact structures coupled to a corresponding one of the first plurality of vias; and an inquiry-side conductor pattern disposed on the inquiry-side, the inquiry-side conductor pattern including a central contact region and a plurality of coplanar conductive links extending therefrom, each of the links having a component placement pad at a coplanar distal end thereof, and further including a plurality of unlinked component placement pads disposed adjacent corresponding ones of the linked component placement pads;

wherein the inquiry-side conductor pattern is repeated at least twice on the inquiry-side; and wherein each of the unlinked component placement pads is electrically isolated from any central contact region.

8. The wafer translator of claim 7, wherein the plurality of contact structures are arranged in a pattern so as to make contact with a corresponding plurality of bond pads on a wafer, when the wafer and wafer translator are in contact with each other.

9. The wafer translator of claim 7, wherein the plurality of coplanar conductive links extending from the central contact region of the inquiry-side conductor pattern comprises four links, each of the four links extending from the central contact region in a direction substantially perpendicular to the direction in which both the link that is clockwise adjacent and the link that is counterclockwise adjacent extend from the central contact region.

10. The wafer translator of claim 7, wherein the inquiry-side conductor pattern is repeated at least twice on the inquiry-side such that a first instance of the inquiry-side conductor pattern includes a first link extending from a first central contact region in the direction of a second instance of the inquiry-side conductor pattern, and the second instance of the inquiry-side conductor pattern includes a second link extending from a second central contact region in the direction of the first instance of the inquiry-side conductor pattern.

11. The wafer translator of claim 10, wherein a first one of the plurality of unlinked component placement pads is disposed in a region between the first link, the first central contact region, the second link, and the second central contact region.

12. The wafer translator of claim 7, wherein the central contact region is larger than the component placement pads at the distal ends of the links.

* * * * *